(12) United States Patent
Fu et al.

(10) Patent No.: US 10,147,631 B2
(45) Date of Patent: Dec. 4, 2018

(54) FLUORO-SILICONE COMPOSITIONS AS TEMPORARY BONDING ADHESIVES

(71) Applicant: Dow Corning Corporation, Midland, MI (US)

(72) Inventors: Peng-Fei Fu, Midland, MI (US); Sheng Wang, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 0 days.

(21) Appl. No.: 15/276,357

(22) Filed: Sep. 26, 2016

(65) Prior Publication Data

US 2018/0090362 A1    Mar. 29, 2018

(51) Int. Cl.
*H01L 21/683*    (2006.01)
*H01L 21/304*    (2006.01)
(Continued)

(52) U.S. Cl.
CPC .......... *H01L 21/6836* (2013.01); *B32B 37/12* (2013.01); *C09J 183/04* (2013.01);
(Continued)

(58) Field of Classification Search
CPC ...... H01L 21/6836; H01L 24/83; B32B 37/12
See application file for complete search history.

(56) References Cited

U.S. PATENT DOCUMENTS

| 7,541,264 B2 | 6/2009 | Gardner et al. |
| 2005/0038188 A1 | 2/2005 | Ahn et al. |

(Continued)

FOREIGN PATENT DOCUMENTS

| EP | 2475002 B1 * | 7/2014 | .............. C08L 83/00 |
| GB | 2350388 A | 3/2016 | |

(Continued)

OTHER PUBLICATIONS

Zussman et al. (Journal of Microelectronics and Electronic Packaging (2010) 7, 214-219).

*Primary Examiner* — Moazzam Hossain
(74) *Attorney, Agent, or Firm* — Warner Norcross & Judd LLP (57) ABSTRACT

Fluoro-containing silicone-based storage stable temporary bonding adhesive compositions are disclosed. The adhesive compositions can be used in varied applications including, but not limited to, 3D chip integration, packaging applications, semiconductor devices, radio-frequency identification tags, chip cards, high-density memory devices, and microelectronic devices. The adhesive compositions generally comprise: a) a fluoro-containing silicone having the general formula (I); $M'[D_oD^f_pD^x_q]_nM'$ wherein M' is a vinyl or hydrogen functionalized unit; $D^f$ unit comprises a fluoro-substituted group; $D^x$ unit comprises a vinyl or SiH functionalized group; $1>o≥0$, $1>p>0$, and $1>q≥0$ wherein o+p+q=1 and p is equal to or less than 20% mole percent of the sum of o+p+q; and n is an integer from 1 to 1000; b) an alkenyl functional polydimethylsiloxane fluid; c) an alkenyl functional MQ siloxane resin; d) an SiH functional siloxane crosslinker; and e) a hydrosilylation catalyst.

20 Claims, 1 Drawing Sheet (51) Int. Cl.
  *H01L 21/768* (2006.01)
  *H01L 23/00* (2006.01)
  *B32B 37/12* (2006.01)
  *C09J 183/08* (2006.01)
  *C09J 183/04* (2006.01)
  *C08G 77/12* (2006.01)
  *C08G 77/20* (2006.01)
  *C08G 77/24* (2006.01)

(52) U.S. Cl.
  CPC ...... *H01L 21/304* (2013.01); *H01L 21/76898* (2013.01); *H01L 24/29* (2013.01); *H01L 24/83* (2013.01); *B32B 2307/20* (2013.01); *B32B 2383/00* (2013.01); *B32B 2457/14* (2013.01); *C08G 77/12* (2013.01); *C08G 77/20* (2013.01); *C08G 77/24* (2013.01); *H01L 2221/68327* (2013.01); *H01L 2221/68386* (2013.01); *H01L 2224/29191* (2013.01); *H01L 2224/83855* (2013.01); *H01L 2924/0715* (2013.01); *H01L 2924/0782* (2013.01); *H01L 2924/07802* (2013.01)

(56) References Cited

U.S. PATENT DOCUMENTS

| 2008/0289760 | A1* | 11/2008 | Koshikawa | C08G 65/007 |
| | | | | 156/329 |
| 2009/0017323 | A1* | 1/2009 | Webb | B32B 37/12 |
| | | | | 428/521 |
| 2011/0136321 | A1 | 6/2011 | Kuroda et al. | |
| 2012/0175045 | A1* | 7/2012 | Furuya | C08L 83/00 |
| | | | | 156/154 |
| 2013/0032296 | A1* | 2/2013 | Zhong | C11D 1/22 |
| | | | | 156/704 |
| 2017/0200628 | A1* | 7/2017 | Kamibayashi | C09J 183/04 |

FOREIGN PATENT DOCUMENTS

| WO | WO2012118700 A1 | 9/2012 |
| WO | WO2014160067 A1 | 10/2014 |

* cited by examiner

FIGURE 1

FLUORO-SILICONE COMPOSITIONS AS TEMPORARY BONDING ADHESIVES

FIELD OF THE INVENTION

The present invention is in the field of temporary bonding adhesives. In particular, the present invention is related to applications where storage stable temporary bonding adhesives are needed that provide for easy and safe debonding.

BACKGROUND OF THE INVENTION

As semiconductor manufacturers continue to reduce the thickness of devices, existing technologies are inadequate for solving the manufacturing challenges associated with procedures for making smaller devices. Emerging products, such as radio-frequency identification tags, sophisticated chip cards, and high-density memory devices, along with the advent of new and advanced packaging technologies for a variety of products such as micro-devices and sensors, require increasingly thinner wafers for the microfabrication of integrated circuits. While such thin wafers (e.g. 20-100 µm) exhibit increased flexibility, which in some cases is actually desired, they also exhibit increased fragility. The lack of adequate mechanical support and the increased fragility of thin wafers present major challenges to maintain high yield production in volume manufacturing environments.

Temporary bonding and debonding techniques, utilizing temporary bonding adhesives with a carrier or support wafer to provide mechanical support for a device wafer, is one approach in processing thin wafers. Published patent application US2012/0175045 discloses a solvent-based temporary bonding adhesive composition consisting of a vinyl T-containing polymer, a SiH containing crosslinker, a Pt catalyst, and an organic solvent with boiling point of less than 220° C. Published patent application US2011/0136321 and U.S. Pat. No. 7,541,264 disclose a silicone pressure-sensitive adhesive (PSA) approach. Zussman et al. (*J. Microelectronics and Electronic Packaging*, 2010, 7, 214-219) discloses an organic polymer such as polyimide as temporary bonding adhesives. Published PCT application WO2012/118700 describes a temporary bonding adhesive technology involving a two-layer material approach: a silsesquioxane resin based release layer and a polydimethylsiloxane based adhesive layer.

Alternative temporary bonding adhesives are needed to provide reliable and easy debonding while at the same time enable safe handling and processing of thin wafers. Such alternative temporary bonding adhesives must also be compatible with existing equipment lines and manufacturing processes.

BRIEF SUMMARY OF THE INVENTION

The present invention relates to fluoro-containing silicones as storage stable temporary bonding adhesives (TBA) for temporary bonding applications. The fluoro-containing silicones can be used to formulate temporary bonding adhesive compositions comprising at least one fluoro-containing silicone component, wherein the compositions when coated onto a first substrate form a film that can be bonded to a second substrate to form a laminate sequentially comprising the first substrate, the film, and the second substrate; and debonded from the second substrate to obtain a second substrate substantially free of the fluoro-containing silicone.

DETAILED DESCRIPTION OF THE INVENTION

Figure 1:
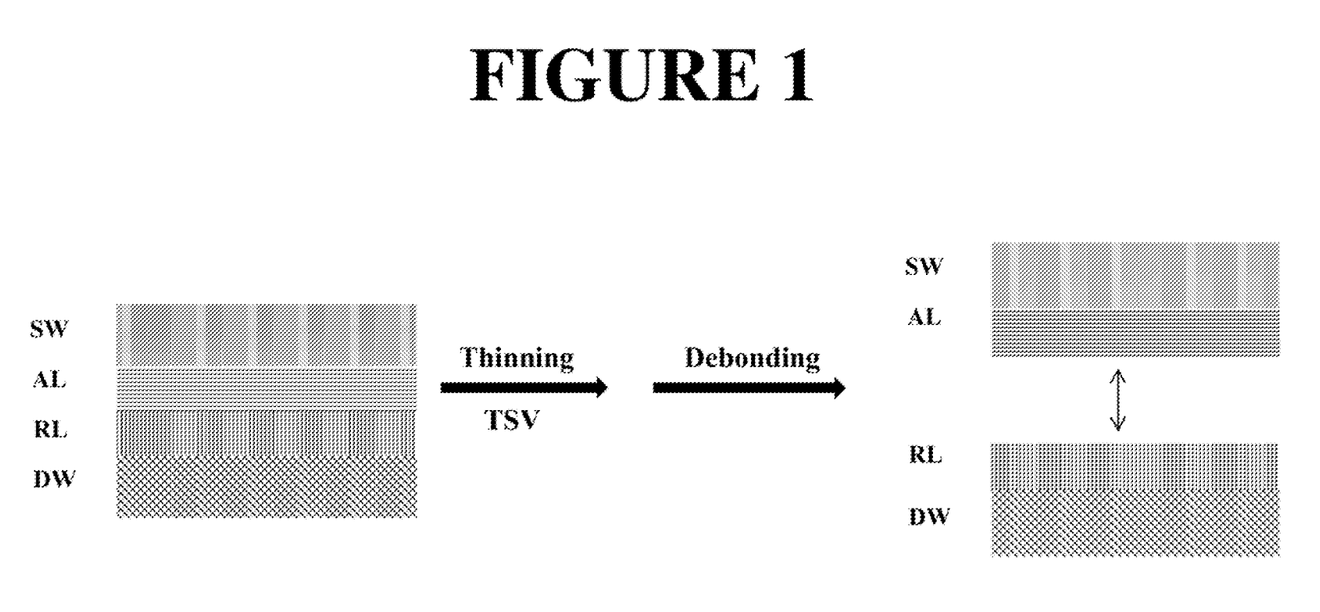
FIG. 1 shows a schematic representation wherein a temporary bonding adhesive composition is applied to a layer and having additional functional layers. "DW" means device wafer; "RL" means release layer; "AL" means adhesive layer comprising a temporary bonding adhesive composition; "SW" means support wafer; and "TSV" means through-silicon via processing.

The fluoro-containing silicones of the present invention are useful as storage stable temporary bonding adhesives. While the present invention encompasses various modifications and alternative forms of the fluoro-containing silicones, the following specific embodiments illustrate certain compositions and methods of the present invention that are not intended to be limiting. Rather, the present invention is intended to cover all modifications, equivalents, and alternatives falling within the spirit and scope of the present invention.

The inventors of the present invention surprisingly and unexpectedly found that the debonding force in temporary bonding adhesives can be modified by attaching organic groups with one or more fluoro substituents to the backbone of a silicone. The debonding force decreases as the amount of the fluoro-substituted organic groups in the adhesive composition increases up to a certain amount. By changing the amount of the fluoro substituent in the adhesive compositions of the present invention, either by changing the amount of the fluoro substituent in the organic group, the amount of the fluoro-substituted organic groups attached to the silicone, or the amount of fluoro-containing silicone in the adhesive composition, the debonding force can be modulated to meet the requirements of specific applications. For example, the debonding force can be modified so as to produce temporary bonding adhesives that can easily debond, or to replace other temporary bonding adhesives that fail to debond in specific applications.

The terms "comprising" or "comprise" are used herein in their broadest sense to mean and encompass the notions of "including", "include", "consist(ing) essentially of", and "consist(ing) of". The use of "for example", "e.g.", "such as", and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-10, ±0-5, or ±0-2.5% of the numerical values. Further, The term "about" applies to both numerical values when associated with a range of values. Moreover, the term "about" may apply to numerical values even when not explicitly stated.

The term "ambient temperature" or "room temperature" as used herein refers to a temperature of from about 20-30° C. Usually, "room temperature" ranges from about 20-25° C. All viscosity measurements referred to herein were measured at 25° C. unless otherwise indicated. Generally, as used herein a hyphen "-" or dash "—" in a range of values is "to" or "through"; a ">" is "above" or "greater-than"; a "≥" is "at least" or "greater-than or equal to"; a "<" is "below" or "less-than"; and a "≤" is "at most" or "less-than or equal to".

As used herein, the term "MQ" refers to silicone resins derived from the symbols M, D, T, and Q, each of which represent a functionality of different types of structural units which may be present in silicone resins containing siloxane units joined by Si—O—Si bonds. Monofunctional (M) unit represents $R_3SiO_{1/2}$, difunctional (D) unit represents $R_2SiO_{2/2}$, and trifunctional (T) unit represents $R_3SiO_{3/2}$. R is a hydrocarbyl group, such as methyl, unless indicated otherwise. The T units results in the formation of branched linear siloxanes. Tetrafunctional (Q) unit represents $SiO_{4/2}$, which results in the formation of resinous silicone compositions.

Generic structural formulas of these units are shown below:

In these structures/formulae, each $R^0$ may be any hydrocarbon, aromatic, aliphatic, alkyl, alkenyl, or alkynl group.

As used herein, the term "oligomer" or "oligomeric" refers to a molecule that consists of a few monomer units and of intermediate relative molecular mass. For example, dimers, trimers, and tetramers are oligomers. In contrast, polymers are large molecules composed of many repeated subunits.

As used herein, the term "organic group" or "organic groups" means a molecule containing one or more carbon atoms. Organic group or organic groups comprise hydrocarbons or hydrocarbyl groups. For example, organic group can be described to be a $C_1$-$C_{23}$ or $C_3$-$C_{23}$ hydrocarbyl group.

As used herein "hydrocarbyl" means a hydrocarbon from which one hydrogen atom has been removed. Hydrocarbyl comprises saturated, unsaturated, branched, unbranched, aromatic, nonaromatic, cyclic, and noncyclic hydrocarbons.

As used herein "substrate" means wafer is used as a general term to refer to a silicon wafer, a support, a carrier wafer, an ultrathin wafer, or a device wafer.

"A" and "an" mean one or more. For example, a fluoro substituted $C_3$-$C_{23}$ hydrocarbyl group, or an SiH functional organosiloxane polymer comprising a fluoro-substituted $C_3$-$C_{23}$ hydrocarbyl group mean one or more that can be the same or different.

In one embodiment, the present invention provides a temporary bonding adhesive composition comprising at least one fluoro-containing silicone, wherein the composition when coated onto a first substrate forms a film that can be bonded to a second substrate to form a laminate sequentially comprising the first substrate, the film, and the second substrate; and debonded from the second substrate to obtain a second substrate substantially free of the fluoro-containing silicone. The adhesive compositions can be stable at room temperature for at least one month and can be thermally cured at a temperature above 100° C.

By "substantially free," it is generally meant that the second substrate includes less than about 10, less than about 5, or less than about 1, wt % of the film after debonding, based on the total weight of the originally bonded film. In certain embodiments, the second substrate is completely free of the fluoro-containing silicone after debonding.

In another embodiment, the present invention provides temporary bonding adhesive compositions comprising a) at least one fluoro-containing silicone; b) at least one alkenyl functional polydimethylsiloxane fluid; c) at least one alkenyl functional MQ siloxane resin; d) at least one SiH functional siloxane crosslinker; and e) a hydrosilylation catalyst. The compositions may further comprise a cure inhibitor. The alkenyl functional polydimethylsiloxane fluid can be, but is not limited to, a vinyl functional polydimethylsiloxane fluid. The alkenyl functional MQ siloxane resin can be, but is not limited to, vinyl functional MQ siloxane resin.

The Fluoro-Containing Silicones

The fluoro-containing silicones of the present invention are silicon-containing polymers having an organic group with one or more fluoro substituents. For example, the fluoro-containing silicone is an alkenyl functional organosiloxane polymer comprising a fluoro-substituted $C_3$-$C_{23}$ hydrocarbyl group, or an SiH functional organosiloxane polymer comprising a fluoro-substituted $C_3$-$C_{23}$ hydrocarbyl group.

The fluoro-containing silicones of the present invention may be of general formula:

$$M'[D_o D^f_p D^x_q]_n M' \tag{I}$$

wherein M' is a vinyl or hydrogen functionalized unit, $D^f$ unit comprises a fluoro-substituted group, $D^x$ unit comprises a vinyl or silicon hydride (SiH) functionalised group; 1>o≥0, 1>p>0, and 1>q≥0 wherein o+p+q=1 and p is equal or less than 20% mole percent of the sum of o+p+q; and n is an integer from 1 to 1000. For example, the temporary bonding adhesives having fluoro-containing silicones of the present invention can be used in surfaces with low surface adhesion (such as in applications with an interposer) where selective debonding is required, as well as debonding from surfaces having high surface energy (such as applications with a higher surface energy release layer).

The fluoro-containing silicones of formula (I) can also be used in combination with polydiorganosiloxane of formula $M(D)_mM$ and/or with fluoro-containing silicone material of formula $M(D^f)_mM$ wherein m is an integer from 1 to 100. Such combinations are stable and do not result in phase separation and do not produce opaque articles which are undesired for microelectronic applications. The fluoro-containing silicone of formula (I), having 20% or less mole fraction of the D$^f$ unit comprising a fluoro-substituted group, is miscible with polydiorganosiloxane of formula M(D)$_m$M to form a clear and stable formulations having a lower surface adhesion force. The fluoro-containing silicones of formula (I) can also be used with other polydimethylsiloxane (PDMS) compatible intermediates (e.g. SiH crosslinkers and fillers) to form fluoro-containing temporary bonding adhesive.

In one embodiment, the fluoro-containing alkenyl functional organosiloxane polymer may have the general formula:

wherein each R is independently a $C_1$-$C_6$ hydrocarbyl group; R$^f$ is a fluoro-substituted $C_3$-$C_{23}$ hydrocarbyl group; X is an alkenyl group, including but not limited to, $H_2C=CH-$, $H_2C=CHCH_2-$, $H_2C=C(CH_3)CH_2-$, $H_2C=CHCH_2CH_2-$, $H_2C=CHCH_2CH_2CH_2-$, and $H_2C=CHCH_2CH_2CH_2CH_2-$; R$^1$ is either a hydrocarbyl group (R) or/and an alkenyl group (X) group; n is an integer from 1 to 1000; and 1>o≥0, 1>p>0, and 1>q≥0 wherein o+p+q=1 and p is equal to or less than 20% mole percent of the sum of o+p+q.

In a specific embodiment, the fluoro-substituted group comprises at least $-(CH_2)_2CF_3$ or $-(CH_2)_2(CF_2)_5CF_3$.

In one embodiment, the fluoro-containing alkenyl functional organosiloxane polymers comprising a fluoro-substituted $C_3$-$C_{23}$ hydrocarbyl group include, but are not limited to, vinyl terminated polydimethylsiloxane polymers where the degree of polymerization is about 500. In another embodiment, the fluoro-containing alkenyl functional polysiloxane polymers comprising a fluoro-substituted $C_3$-$C_{23}$ hydrocarbyl group include, but are not limited to, polymers having vinyl fluoro cyclic monomers of general formula $[D_dD^f_eD^{Vi}_g]_k$ wherein 1>d≥0, 1>e>0, 1>g>0, d+e+g=1, and e is equal to or less than 20% mole percent of the sum of d+e+g; Vi is a vinyl group; and k is an integer from 1 to 20. For example, the vinyl fluoro cyclic monomers can have the formula:

In still another embodiment, the fluoro-containing alkenyl functional organosiloxane polymers comprising a fluoro-substituted $C_3$-$C_{23}$ hydrocarbyl group include, T containing monomers such as:

wherein 1>m≥0 or 1>m>0, 1>n>0, 1>s≥0 or 1>s>0, and m+n+s=1; and Q containing monomers such as:

wherein 1>m≥0 or 1>m>0, 1>n>0, 1>s≥0 or 1>s>0, and m+n+s=1.

The fluoro-containing SiH functional organosiloxane polymer may have the general formula:

wherein each R is independently a $C_1$-$C_6$ hydrocarbyl group; R$^f$ is a fluoro-substituted $C_3$-$C_{23}$ hydrocarbyl group; n is an integer from 1 to 1000; R$^1$ is either a hydrocarbyl group (R) or/and a hydride group; and 1>o≥0, 1>p>0, and 1>q≥0 wherein o+p+q=1 and p is equal to or less than 20% mole percent of the sum of o+p+q. When R$^1$ is a hydrocarbyl group (R) group, 1>o≥0, 1>p>0, and 1>q>0 wherein o+p+q=1 and p is equal to or less than 20% mole percent of the sum of o+p+q.

In one embodiment, the SiH functional siloxane polymer comprises at least one unit that is (H)SiO$_{2/2}$(CH$_2$)$_2$CF$_3$) or (H)SiO$_{2/2}$(CH$_2$)$_2$(CF$_2$)$_5$CF$_3$).

Non-limiting examples of fluoro-containing SiH functional organosiloxane polymers comprising a fluoro-substituted $C_3$-$C_{23}$ hydrocarbyl group include, but are not limited to, HSiMe$_2$-[(OSiMe$_2$)$_x$(OSiMeR$^f$)$_y$]$_n$—OSiMe$_2$H and Me$_3$Si—[(OSiMe$_2$)$_x$(OSiMR$^f$)$_y$(OSiMeH)$_z$]$_n$—OSiMe$_3$.

In one embodiment, each $R^1$ and each R is independently methyl, ethyl, n-propyl, propan-2-yl, n-butyl, sec-butyl, isobutyl, tert-butyl, phenyl or naphthyl groups; $R^f$ is $-(CH_2)_2(CF_2)_wCF_3$, wherein w is 0 or an integer from 1 to 20. In other embodiments, $R^f$ is $-(CH_2)_2CF_3$, $-(CH_2)_2(CF_2)_5CF_3$, $-(CH_2)_2(CF_2)_7CF_3$, or $-(CH_2)_2(CF_2)_9CF_3$.

The Alkenyl Functional Polydimethylsiloxane Fluids

The alkenyl functional polydimethylsiloxane fluid can have the general formula:

wherein $R_1$ is an alkenyl group, including but not limited to, $H_2C=CH-$, $H_2C=CHCH_2-$, $H_2C=C(CH_3)CH_2-$, $H_2C=CHCH_2CH_2-$, $H_2C=CHCH_2CH_2CH_2-$, and $H_2C=CHCH_2CH_2CH_2CH_2-$; a and b are the molar ratio of the two structural units, $1 \geq a \geq 0$, $1 \geq b \geq 0$, and $a+b=1$; and c is the number of the repeating units, $c \geq 1$, alternatively, c is from 1 to 10000 or alternatively, c is from 1 to 1000.

Non-limiting examples of alkenyl functional polydimethylsiloxane fluid include vinyl terminated polydimethylsiloxane fluid, $CH_2=CH-SiMe_2-(OSiMe_2)_c-OSiMe_2-CH=CH_2$, wherein $c \geq 0$; Me is a methyl group; and vinyl terminated polydimethylsiloxane polymer fluid where the degree of polymerization (DP) is 500.

The Alkenyl Functional MQ Siloxane Resins

The alkenyl functional MQ siloxane resin has the general formula:

wherein $R^1$ is an alkenyl group, including but not limiting to, $H_2C=CH-$, $H_2C=CHCH_2-$, $H_2C=C(CH_3)CH_2-$, $H_2C=CHCH_2CH_2-$, $H_2C=CHCH_2CH_2CH_2-$, and $H_2C=CHCH_2CH_2CH_2CH_2-$. One non-limiting example of a suitable alkenyl functional MQ siloxane resin is a vinyl functional MQ resin where the vinyl content weight percent is in the range of 0.5 to 5.0. Another non-limiting example of a suitable alkenyl functional MQ siloxane resin is a vinyl-functionalized silicone resin.

The SiH Functional Siloxane Crosslinkers

The SiH functional siloxane crosslinker has the general formula:

wherein $R^1$ is a hydride group or a methyl group; h and j are the molar ratio of the two structural units, $1 \geq h \geq 0$ (if $R^1$ is a methyl group, $1 \geq h > 0$), $1 \geq j \geq 0$, and $h+j=1$; k is the number of repeating units wherein $k \geq 1$, or k is from 1 to 100, k is from 1 to 50, k is from 1 to 20, or k is from 1 to 10. One non-limiting example of a suitable SiH functional siloxane crosslinker is an SiH crosslinker with the structure $MD_3D^H_5M$. Another non-limiting example of a suitable SiH functional siloxane crosslinker is an SiH functional oligomeric silicone resin, including $MD^H_zM$ where z=10-100.

The Hydrosilylation Catalysts

The hydrosilylation catalyst for use in the compositions detailed herein is a transition metal catalyst, including, but not limited to, platinum catalysts, rhodium catalysts, ruthenium catalysts, palladium catalysts, osmium catalysts, iridium catalysts, platinum catalysts, and encapsulated transition metal catalysts, as well as any mixtures or complexes thereof. The transition metal catalysts may comprise solid or hollow particles, a metal layer deposited on a carrier such as silica gel or powdered charcoal, or an organometallic compound or complex containing the transition metal. Examples of transition metal-containing catalysts include, but are not limited to, chloroplatinic acid, either in hexahydrate form or anhydrous form, a platinum-containing catalyst obtained by reacting chloroplatinic acid or platinum dichloride with an aliphatically unsaturated organosilicon compound, a platinum(0)-1,3-divinyl-1,1,3,3-tetramethyldisiloxane complex, platinum acetylacetonate, platinum-divinyl-tetramethyldisiloxane catalyst. Other suitable catalysts may also be used including, but not limited to, those disclosed in PCT Publication No. WO2012/118700, which is incorporated by reference in its entirety. The catalyst may be added as a single catalyst species or as a mixture of two or more different species. The hydrosilylation catalyst may be present in any amount sufficient to provide at least 1 part per million (ppm) of the catalyst in the composition. Alternatively, the amount of the catalyst present in the composition is from about 1 part per million (ppm) to about 5000 ppm. Alternatively, the amount of catalyst present in the adhesive compositions is about 5 ppm to about 2000 ppm.

The Cure Inhibitors

The cure inhibitor for use in the embodiments detailed herein is an organic compound. The cure inhibitor is capable of interacting with the catalyst in order to delay the initiation of the catalyzed reaction. In some embodiments, the cure inhibitor is an organic compound that comprises at least one unsaturated bond and/or at least one heteroatom. In one embodiment, the cure inhibitor is a maleate compound having the general formula:

wherein $R^2$ is an organic group. In one embodiment, $R^2$ is a $C_1$-$C_6$ hydrocarbyl group. In some embodiments, the cure inhibitor is diallyl maleate. In still further embodiments, the cure inhibitor may include various hydrosilylation inhibitors such as, but not limited to, an amine, an alkenyl ester, an alkynyl alcohol, acetylenic alcohols, phosphorus-containing compounds, nitrogen-containing compounds, and sulfur-containing compounds. Further non-limiting examples of suitable cure inhibitors include ethynyl cyclohexanol, bis-2-methoxy-1-methylethylmaleate, and N,N,N',N'-tetramethylethylenediamine. In general, the weight percent of the cure inhibitor present in the fluoro-containing silicone temporary bonding adhesive compositions is below 1%. The weight percent of the cure inhibitor is expected to vary as each inhibitor possesses a different molecular weight.

The molar ratio of the cure inhibitor to the hydrosilylation catalyst ([cure inhibitor]:[catalyst]) is greater than 40:1, alternatively from about 40:1 to about 300:1. In still further embodiments, the molar ratio of the cure inhibitor to the hydrosilylation catalyst is in the range of about 100:1 to about 300:1 or about 200:1.

The present invention provides a cured composition comprising the temporary bonding adhesive compositions of the present invention; and a semiconductor coated with the temporary bonding adhesive compositions of the present invention. The semiconductor may be a wafer.

In another embodiment, the present invention provides methods for making a temporary bonded substrate system comprising the temporary bonding adhesive compositions to bond a first substrate with a second substrate. In one embodiment, the method comprises (1) blending a) at least one fluoro-containing silicone; b) at least one alkenyl functional polydimethylsiloxane fluid; c) at least one alkenyl functional MQ siloxane resin; d) at least one SiH functional siloxane crosslinker; e) a hydrosilylation catalyst; and f) a cure inhibitor to obtain a temporary bonding adhesive composition, wherein the molar ratio of the cure inhibitor to the hydrosilylation catalyst is about 40:1 or greater; (2) providing a device wafer and a carrier wafer; (3) applying a release layer to the surface of a device wafer to form a release layer coated device wafer; (4) applying the temporary bonding adhesive composition onto the release layer of the release layer coated device wafer to form an adhesive coated device wafer, wherein the adhesive composition applied onto the release layer forms a temporary bonding adhesive film having a thickness of from about 1 micrometer to about 500 micrometers; (5) applying the carrier wafer onto the temporary bonding adhesive film and curing the temporary bonding adhesive film to form a temporary bonded wafer system; 6) bonding the carrier wafer and the adhesive coated device wafer together by curing the temporary bonding adhesive film to form a temporary bonded wafer system, wherein the temporary bonding adhesive film is in contact with the release layer and with a surface of the carrier wafer; (7) optionally performing at least one wafer processing operation on the device wafer to form a processed wafer system; (8) optionally debonding the processed wafer system by initiating separation between the release layer and the cured temporary bonding adhesive film to obtain a processed device wafer; and (9) optionally cleaning at least one surface of the processed device wafer with an organic solvent, wherein the organic solvent is capable of dissolving the release layer.

In another embodiment, instead of applying the temporary bonding adhesive composition onto the release layer of the release layer coated device wafer and bonding as in steps (4) and (5) above, the temporary bonding adhesive composition is applied to a surface of the carrier wafer to form an adhesive coated carrier wafer, wherein the adhesive composition applied onto the surface of the carrier wafer forms a temporary bonding adhesive film having a thickness from about 1 micrometer to about 500 micrometer; and bonding the release layer coated device wafer and the adhesive coated carrier wafer together by curing the temporary bonding adhesive film to form a temporary bonded wafer system, where the cured temporary bonding adhesive film is in contact with the release layer and the surface of the carrier wafer.

The release layer can be formed by, but not limited to, a silsesquioxane-based resin or a thermoplastic resin, wherein the release layer is capable of withstanding exposure up to about 180° C. without the occurrence of substantial crosslinking.

The fluoro-containing silicones of the present invention exhibit advantageous characteristics suitable as temporary bonding adhesives. The fluoro-containing silicones of the present invention do not exhibit a bonding force onto a release layer on a wafer that upon debonding may lead to breakage of the wafer. The fluoro-containing silicones of the present invention have at least one of the following advantages: (1) can be formulated into one-part temporary bonding adhesive compositions; (2) demonstrate improved release properties compared with other temporary bonding adhesive compositions having non-fluoro-containing silicones or non-silicone adhesives; (3) exhibit good storage stability and shelf-life (greater than two weeks at room temperature and greater than three months at 5° C.); (4) exhibit fast curing (less than a minute) when heated at elevated temperature (greater than 80° C. or a temperature range from 100° C. to 180° C., or 120° C. to 150° C.); (5) are spin-coatable to a film thickness from about 10 to about 200 microns; (6) are solvent-free compositions; (7) can form free standing films with good mechanical properties for post processing steps; (8) can withstand high temperatures (for example, 260° C. for 10 minutes) without outgassing and delamination; (9) can survive harsh backgrinding and subsequent through-silicon via processing conditions such as resistant to solvents, laser and/or plasma; and (10) allow room temperature wafer debonding.

The fluoro-containing silicones of the present invention are therefore useful for a wide range of applications, including, but not limited to, 3D chip integration, packaging applications, semiconductor devices, radio-frequency identification tags, chip cards, high-density memory devices, and microelectronic devices.

Optional Component(s)

One or more additional optional components can be included in the storage stable temporary bonding adhesive compositions of the present invention. These additional optional components include, but are not limited to, fillers such as talc, silica, and calcium carbonate, stabilizers, absorbents, pigments, plasticizers, additives for improving adhesion, fluids or other materials conventionally used in gels, gelling agents, silicone fluids, silicone waxes, silicone polyethers, surfactants, and rheology modifiers such as thickening agents or thixotropic agents.

The filler can be an alkenyl functional filler having a particle size below one micrometer (μm). In some embodiments, the alkenyl functional filler is a vinyl functional silicone resin. In other embodiments, the alkenyl functional filler is a vinyl functional silica. In still further embodiments, the alkenyl functional filler is, for example, a vinyl functional colloidal silica, a vinyl functional nanoparticle, or a vinyl MQ resin. The vinyl MQ resin may have the following structural units:

$(Me_3SiO_{1/2})(R^1Me_2SiO_{1/2})(SiO_{4/2})$ wherein $R^1$ is an alkenyl group, including but not limiting to, $H_2C=CH-$, $H_2C=CHCH_2-$, $H_2C=C(CH_3)CH_2-$, $H_2C=CHCH_2CH_2-$, $H_2C=CHCH_2CH_2CH_2-$, and $H_2C=CHCH_2CH_2CH_2CH_2-$. One non-limiting example of a suitable alkenyl functional filler is a vinyl functional MQ resin where the vinyl content by weight percent is in the range of 0.5 to 5.0. Another non-limiting example of a suitable alkenyl functional filler is a vinyl-functionalized oligomeric silicone resin.

The molar ratio of the SiH functional siloxane crosslinker to that of the alkenyl functional filler is in the range of about 0.8 to about 3.0. In further embodiments, the molar ratio is in the range of about 1.0 to about 2.0.

The components of the temporary bonding adhesive compositions of the present invention, fluoro-containing silicone, alkenyl functional polydimethylsiloxane fluid, alkenyl functional MQ siloxane resin, SiH functional siloxane crosslinker; hydrosilylation catalyst, optionally the cure inhibitor, and any optional additional components, are mixed or blended by any suitable technique which results in mixing or blending of the components. The adhesive compositions may be stored for more than 2 weeks at room temperature and more than 3 months at 5° C. and exhibit excellent shelf-life properties. For example, the adhesive compositions are stable for at least one month at room temperature or for at least six months at 3° C. to 4° C.

The fluoro-containing silicone temporary bonding adhesive compositions of the present invention can be used as one-part compositions. Thus, the compositions can be taken directly from the shelf by an end user and used without the need for mixing and/or de-airing. The compositions have pre-gel times greater than 1 minute at a temperature below 100° C. Pre-gel time is a time, starting from t=0 to the time after the composition is baked at a specific temperature, when the surface of the composition is still tacky and not flowable when tilted, but flowable under slight pressure. Having a composition with a long pre-gel time is desirable for successful temporary bonding in a temporary bonding chamber.

The fluoro-containing silicone temporary bonding adhesive compositions are advantageous as they are solventless. In other words, by "solventless," the compositions require no solvent in order for the various components to be combined to form the compositions of the present invention. This saves on, for example, materials, process steps, and facilities for handling solvents as well as makes the compositions environmentally-friendly as they can be formed using fewer chemicals and fewer processing steps.

Optionally, once the fluoro-containing silicone temporary bonding adhesive compositions are formulated (for example, by combining the components without solvent), the compositions can be diluted with an organic solvent or a mixture of organic solvents to form solvent based fluoro-containing silicone temporary bonding adhesive compositions. This may be desirable in situations, for example, where a thinner adhesive film is desired or required for post-processing steps or desired end uses of the compositions. Non-limiting examples of suitable organic solvents include ethyl acetate, propyl acetate, ethyl propionate, butyl acetate, ethyl butyrate, propylene glycol methyl ether acetate (PGMEA), 2-butanone, methyl isobutyl ketone (MIB K), xylene, mesitylene, cyclopentanone, cyclohexanone, and 2-heptanone.

Once the components are combined to form the fluoro-containing silicone temporary bonding adhesive compositions, processes may be employed to process the temporary bonding adhesive compositions into a form more desired by the end user. The storage stable fluoro-containing temporary bonding adhesive compositions described herein possess good mechanical properties for post processing steps.

The fluoro-containing silicone temporary bonding adhesive compositions can be coated onto a surface of a substrate (including, but not limited to, silicon, glass, SiC, metal wafers or panels, etc.) to form a film on the substrate. The coating may be applied by spin coating, spray coating, flow coating, or other suitable coating methods. Spin coating provides thickness control, simplicity and fast processing. When spin coating is used, the temporary bonding compositions are coatable to a film thickness from about 1 micrometer ($\mu m$) to about 500 $\mu m$. In alternative embodiments, the film thickness resulting from the spin coating may be from about 10 $\mu m$ to about 200 $\mu m$ or from about 20 $\mu m$ to about 100 $\mu m$. Such processing techniques can produce a uniform film.

A thermal process may be employed to cure the film and form a tacky-free and mechanically strong film. The fluoro-containing silicone temporary bonding adhesive compositions described herein can be cured quickly at a temperature above 80° C. to form a mechanically strong film. In alternative embodiments, the temperature is above 100° C. At these temperatures, the compositions described herein can be cured within a few minutes. The fast curing property places the compositions in a more user-friendly form for its ultimate end uses as discussed below.

In one embodiment, the present invention provides a method of using the fluoro-containing silicone temporary bonding adhesive compositions and a release layer for providing a temporary bond between a device wafer or substrate and a carrier wafer in order to perform at least one wafer processing operation to form a processed wafer or processed wafer system, debonding the wafers, and subsequently cleaning the processed device wafer. This method generally comprises providing a device wafer and a carrier wafer for subsequent coating. The release layer is coated onto the surface of the device wafer to form a release layer coated device wafer. The release layer may be coated using conventional techniques known to one skilled in the art, including but not limited to, spin coating, spray coating, flow coating, and the like. The release layer coated device wafer may be prebaked at a temperature in the range of about 80° C. to about 180° C. Similarly, a fluoro-containing silicone temporary bonding adhesive composition is coated onto the surface of the carrier wafer using conventional techniques to form an adhesive coated wafer with a film thickness from about 1 micrometer to about 500 micrometer.

The adhesive coated carrier wafer and the release layer coated device wafer are then bonded together by placing the fluoro-containing silicone temporary bonding adhesive compositions in contact with the release layer to form a bonded wafer system. The coated wafers are bonded together by curing the fluoro-containing silicone temporary bonding adhesive in a vacuum oven at a predetermined reduced pressure and temperature level or in a conventional oven at a higher temperature.

In the bonded wafer system, the carrier wafer provides the necessary support to the device wafer in order for subsequent operations or processes, such as wafer grinding, among others to be performed. Once the device wafer is processed into a very thin wafer, additional processes, such as through-silicon vias (TSV), may be optionally performed on the processed wafer system when desired.

The processed wafer system can be mechanically debonded by initiating an indentation with a sharp knife, such as a razor blade, at the edge of the interface between the release layer and the adhesive. The separation of the release layer from the fluoro-containing silicone temporary bonding adhesive composition leads to the formation of a thin processed device wafer. In the bonded wafer system, the adhesive layer is used to support the device wafer. The release layer is used to promote debonding in the processed wafer system when the grinding and any subsequent processing is completed.

Optionally, in order to handle and use the thin processed device wafer after being debonded and cleaned, the back-side surface of the processed device wafer may be laminated or permanently bonded to dicing tape. The back-side surface of the processed device wafer is defined as the side of the wafer that is not in contact with either the release layer or the adhesive. The lamination or bonding to the dicing tape may be performed prior to exposing the process wafer system to the debonding and cleaning steps.

The processed device wafer may then be exposed to an organic solvent that will act as a surface cleaning agent. The release layer or any residue thereof can be removed from the processed device wafer by spraying a solvent onto the processed device wafer or by soaking the processed device wafer in an organic solvent in which the release layer is soluble. The organic solvent also cleans the surface of the wafer upon which the release layer was coated. Any organic solvent can be used to clean the processed device wafer provided that the solvent is capable of dissolving the release layer and can meet any necessary regulatory requirements. Several examples of an organic solvent include but are not limited to, toluene, xylene, mesitylene, propylene glycol methyl ether acetate (PGMEA), cyclopentanone, cyclohexanone, 2-butanone, and butyl acetate.

One skilled in the art will understand that the method may be modified to allow the adhesive composition to be applied to the release layer coated device wafer prior to bonding to a uncoated carrier wafer or another release layer coated carrier wafer. The subsequent bonding process and other processes should be similar.

In one embodiment, the present invention provides a method using the fluoro-containing silicone temporary bonding adhesive compositions and a release layer for providing a temporary bond between a first and second wafer in order to perform at least one processing operation to form a processed wafer, debonding the wafers, and subsequently cleaning the processed wafer. The release layer is coated onto the surface of a first wafer to form a release layer coated wafer. The release layer may be coated using conventional techniques known to one skilled in the art, including but not limited to, spin coating, spray coating, flow coating, and the like. Similarly, the fluoro-containing silicone temporary bonding adhesive composition is coated onto the surface of a second wafer using conventional techniques to form an adhesive coated wafer. One skilled in the art will understand that the first and second wafers may be selected from support wafer or a wafer upon which subsequent processing will be performed, such as a patterned wafer. The first and second wafers are different from one another. The release layer coated wafer may be prebaked at a temperature in the range of about 100° C. to about 120° C.

The adhesive coated wafer and the release layer coated wafer are then bonded together by placing the adhesive composition in contact with the release layer to form a bonded wafer system. The coated wafers may be bonded by curing the fluoro-containing silicone temporary bonding adhesive in a vacuum oven at a predetermined reduced pressure and temperature level, or in a conventional oven at a higher temperature when the catalyst in the adhesive is thermally activated. If the catalyst in the adhesive composition is photo-activated, the coated wafers may be bonded upon exposure to ultraviolet (UV) radiation with further cure possible upon exposure to an elevated temperature.

In the bonded wafer system, the support wafer provides the necessary support to the patterned wafer in order for subsequent operations or processes, such as wafer grinding, among others to be performed. The wafer processing is performed on the patterned wafer to form a processed wafer system. Once the patterned wafer is processed into a very thin wafer, additional processes, such as through-silicon vias (TSV), may be optionally performed on the processed wafer system when desired.

The processed wafer system can be debonded by initiating an indentation with a sharp object, such as a razor blade, at the edge of the interface between the release layer and the adhesive composition. The separation of the release layer from the adhesive composition leads to the formation of a thin processed wafer. In the bonded wafer system, the adhesive composition layer is used to support the patterned wafer. The release layer is used to promote debonding in the processed wafer system when the grinding and any subsequent processing is completed.

Optionally, in order to handle and use the thin processed wafer after being debonded and cleaned, the back-side surface of the processed wafer may be laminated or permanently bonded to dicing tape. The back-side surface of the processed wafer is defined as the side of the wafer that is not in contact with either the release layer or the adhesive. The lamination or bonding to the dicing tape may be performed prior to exposing the process wafer system to the debonding and cleaning steps.

The processed wafer may then be exposed to an organic solvent that will act as a surface cleaning agent. The release layer or any residue thereof can be removed from the processed wafer by spraying a solvent on to the wafer or by soaking the wafer in an organic solvent in which the release layer is soluble. The organic solvent also cleans the surface of the wafer upon which the release layer was coated.

According to another aspect of the present disclosure, a release layer is provided as part of the bonding system in which the release layer is formed from a material selected from a silsesquioxane-based resin and a thermoplastic material such as a thermoplastic resin. Suitable thermoplastic materials include, but are not limited to, polysulfones, polyimides, and polyetherketones, among others, that can be dissolved in various solvents, such as, but not limited to, N-methylpyrrolidinone and N,N-dimethylacetamide. One non-limiting example of a suitable release layer material is described in PCT Publication No. WO2012/118700, which is incorporated by reference in its entirety. It is contemplated that the release layer is capable of withstanding exposure up to about 180° C. without the occurrence of substantial cross-linking.

The fluoro-containing silicone temporary bonding adhesive compositions can be used in varied applications including, but not limited to, 3D chip integration, packaging applications, light emitting diodes (LEDs), nanoimprint lithography (NIL), micropatterning and nanopatterning to form patterned free-standing films, etc. The adhesive compositions are also useful in semiconductor devices where manufacturers desire to limit the thickness of devices and wafers as the inventive adhesives meet the manufacturing challenges associated with such semiconductor products and processes. More specifically, the adhesive composition may also be used in varied products requiring increasingly thinner substrates such as, but not limited to, radio-frequency identification (RFID) tags, sophisticated chip cards, high-density memory devices, microelectronic devices, temporary wafer bonding applications, and advanced packaging technologies for a variety of products ranging from logic to memory to image sensors.

While ultrathin silicon wafers, such as those in the thickness range of 20 μm to 100 μm, exhibit increased flexibility, such wafers also exhibit increased instability and fragility. The lack of mechanical integrity and the increased fragility can present a challenge to maintaining high yield production in volume manufacturing environments and given the high level of data processing speed required of the wafers. The fluoro-containing silicone temporary bonding adhesive compositions of the present invention provide a means for easy and safe handling of these wafers during the production of semiconductor and other devices. The fluoro-containing silicone temporary bonding adhesive compositions of the present invention are particularly useful in ultrathin silicon wafer applications as adhesive compositions provide mechanical support to the ultrathin silicon wafer.

EXAMPLES

These examples are intended to illustrate the invention to one of ordinary skill in the art and should not be interpreted as limiting the scope of the invention set forth in the claims. All parts and percentages in the examples are on a weight basis and all measurements were indicated at about 23° C., unless otherwise indicated.

Testing Methods

For mechanical properties testing, the formulation was cured in a hot-press within a stainless steel case at 150° C. for 5 min; a cured film with a thickness of ~20 mil (0.02") was cut into three dog-bone specimens with a metal cutter. The dimension of a dog-bone was 62 mm (length)×15 mm (wide end width)×4 mm (middle width). The dog-bone was then placed on a MTS machine where a stress-strain curve was obtained. The final data is an average of three measurements. The material mechanical properties (young's modulus, tensile strength, elongation at break) were then calculated from the stress-strain curve. The hardness of the cured adhesive layer was obtained. The Shore A hardness of the cured adhesive material was measured with a Durometer (Model#306L) according to ASTM D2240. The surface energy and contact angles were obtained from a VCA 2500 instrument at 23° C.). The viscosities of these formulations were measured using a Brookfield DV-E viscometer.

The adhesion force test: Adhesion force tests were conducted to evaluate the adhesion strength between an adhesive layer and a SSQ RL-coated silicon wafer according to ASTM D3330 Peel Adhesion Testing (ASTM D3330/D3330M-04(2010) Standard Test Method for Peel Adhesion Pressure-Sensitive Tape). Specifically, a SSQ-based RL was coated onto a 200 mm silicon wafer and baked at 150° C. for 1 min. A silicone-based AL layer was then coated on the top of the RL-coated silicon wafer. A silane functionalized tape was placed on top of the adhesive and soaked into the wet adhesive layer. Next, the test sample was cured at 150° C. for 2 min. The tape was peeled using a peel tester, and the peel force (the adhesion strength) of each test sample was recorded as an average of three measurements. A lower adhesion force indicated a weaker interfacial adhesion between the AL layer and the RL layer.

Bonding and Debonding Test

First, four 4" diameter silicon wafers were spin-coated at 2000 rpm with a 10% Phenyl-SSQ release solution in butyl acetate, which was baked at 130° C. for 1 minute to form 100-150 nm thick release coating layer on the wafers. Next another four 4" diameter silicon wafers were spin-coated with a fluoro-containing silicone temporary adhesive composition. In a vacuum chamber, a release layer coated wafer was placed on the top of an adhesive coated wafer, and the two wafers were bonded under vacuum for 2 minutes. The bonded wafer system was then heated at 180° C. for 2 min, and at 250° C. for 1 hr. The bonded wafer system was then cooled to room temperature, and subsequently debonded using a razor-blade as a debonding initiator. The relative debond force of each paired wafer was rated according to the easiness of debonding with a scale of 1-5 (debonding scale), where scale 5 is the control wafer pair with a non-fluoro-containing adhesive (of Example 2). The relative debonding force is shown in Table 1 below. As is demonstrated, the fluoro-containing silicone temporary bonding adhesive composition imparts a lower debonding force and allows the fluoro-containing silicone temporary bonding adhesive composition to be used in the circumstances in which non-fluoro-containing adhesives fail to be debonded.

Example 1

Synthesis of Fluoro-Containing Vinyl PDMS Fluid, $M^{Vi}D_{63}D^{f}_{6.7}M^{Vi}$ To a 2 L three-necked flask equipped with a thermometer and purged with nitrogen were loaded $D^{f}_{4}$ (with f=—(CH$_2$)$_2$CF$_3$; 192 g) and $M^{Vi}D_{65}M^{Vi}$ (1000 g). Next, KOH (12 g) was added to the reaction mixture which was stirred while being heated at 130° C. (internal temperature) until the viscosity becomes consistent. The mixture was cooled to 60° C. and followed by the addition of acetic acid to neutralize KOH. The solution was then filtrated via a one micron filter to yield a clear solution. After the solvent was removed using a rotary evaporator, the fluid was further stripped using a POPE still at 180° C. at full vacuum (<1 torr) to yield a clear viscous liquid (1020 g). Viscosity: 350 cP; Characterization: NMR ($^{13}$C and $^{29}$Si): MW=9788; F % mol=9.3% wt; Vi % wt=0.92% wt.

Example 2: A Non-Fluoro-Containing Adhesive

To a dental cup were loaded with (a) a vinyl terminated polydimethylsiloxane polymer fluid (DP=500) (alkenyl functional siloxane polymer); (b) a vinyl functional MQ resin (Vi % wt. approximately 3.0%) (alkenyl functional filler); (c) an SiH crosslinker fluid with a structure of $MD_3D^{H}_5M$ (SiH-containing crosslinker); (d) a platinum-divinyl-tetramethyldisiloxane catalyst (CAS#68478-92-2) (hydrosilylation catalyst); and (e) diallyl maleate (DAM, cure inhibitor). The molar ratio of SiH/Vi for the sample is approximately 1.1 and the molar ratio of [DAM]/[Pt] is 120. The mixture was mixed uniformly using a SpeedMixer (Model# DAC-150-FVZ). The liquid adhesive was cured in a mold sandwiched between two stainless steel plates at 150° C. for 5 min. The hardness and mechanical properties of the adhesive upon cure were tested.

Examples 3 to 5

Fluoro-Containing Silicone Adhesives with Different Fluoro Contents and Viscosities In a dental cup, (a) a vinyl terminated polydimethylsiloxane polymer fluid (DP=500) (alkenyl functional siloxane polymer); (b) a vinyl functional MQ resin (Vi % wt. approximately 3.0%) (alkenyl functional filler (c) an SiH crosslinker fluid with a structure of $MD_3D^{H}_5M$ (SiH-containing crosslinker); (d) a platinum-divinyl-tetramethyldisiloxane catalyst (CAS#68478-92-2) (hydrosilylation catalyst); (e) diallyl maleate cure inhibitor (DAM), and (f) fluoro-containing vinyl PDMS fluid, $M^{Vi}D_{63}D^{f}_{67}M^{Vi}$ with f=—(CH$_2$)$_2$CF$_3$ at different loading amount were added. The molar ratio of SiH/Vi for the sample is approximately 1.1 and the molar ratio of [DAM]/[Pt] is 120. The mixture was mixed uniformly using a SpeedMixer (Model# DAC-150-FVZ). The liquid adhesive was cured in a mold sandwiched between two stainless steel plates at 150° C. for 5 min. The hardness and mechanical properties of the adhesive upon cure were tested. The results are shown in Table 1.

TABLE 1

Properties of Fluoro-Temporary Bonding adhesive

| Ex. | fluoro-vinyl fluid (Wt %) | Viscosity (cP) | Hardness (Shore A) | Young's Modulus (MPa) | Release force (gf/inch) | Water Contact Angle (°) | Surface Energy (dyne/cm) | Debonding Scale |
|---|---|---|---|---|---|---|---|---|
| 2 | 0 | 4,850 | 68 | 12.70 | 14.6 | 105.00 | 21.80 | 5.0 |
| 3 | 4% | 4,229 | 65 | 11.70 | 9.1 | 112.34 | 16.70 | 3.0 |
| 4 | 8% | 2,983 | 62 | 4.93 | 7.9 | 114.26 | 15.90 | 2.2 |
| 5 | 13% | 2,287 | 61 | 4.93 | 7.0 | 113.46 | 15.20 | 1.5 |

Examples 6-9

Storage Stability of the Fluoro-Containing Temporary Bonding Adhesive Compositions Samples were stored at room temperature (RT) and at various times tested. The results are shown in Table 2.

TABLE 2

| Ex. | Fluoro-vinyl fluid (Wt %) | Shelf life at RT* | Pre-gel (snap) Time @ 90° C. | Full cure time @ 150° C. |
|---|---|---|---|---|
| 6 | 0 | >6 weeks | 26 | 2 min |
| 7 | 4% | >6 weeks | 25 | 2 min |
| 9 | 8% | >6 weeks | 28 | 2 min |

*less than 5% viscosity change after storage

Comparative Examples 1 and 2

Two vinyl fluoro-containing fluids were prepared as comparative examples. They were Comparative Examples 1: $M^{Vi}D_{4.5}D^f_3M^{Vi}$ (40% mol $D^f$) (Viscosity about 750 cP) and Comparative Examples 2: $M^{Vi}D^f_{6-8}M^{Vi}$ (100% mole $D^f$) (Viscosity about 1,000 cP).

The comparative examples were added to the temporary adhesive formulations. In a dental cup, (a) a vinyl terminated polydimethylsiloxane polymer fluid (DP=500) (alkenyl functional siloxane polymer); (b) a vinyl functional MQ resin (Vi % wt. approximately 3.0%) (alkenyl functional filler); (c) an SiH crosslinker fluid with a structure of $MD_3D^H{}_5M$ (SiH-containing crosslinker); (d) a platinum-divinyl-tetramethyldisiloxane catalyst (CAS#68478-92-2) (hydrosilylation catalyst); (e) diallyl maleate (cure inhibitor), and (f) a fluoro-containing vinyl PDMS fluid at 4% loading amount (Example 10 or one of the two comparative examples). The molar ratio of SiH/Vi for the sample is approximately 1.1 and the molar ratio of [DAM]/[Pt] is 120. The mixture was mixed uniformly using a SpeedMixer (Model# DAC-150-FVZ). The appearance after mixing and storage in 1 day at RT was recorded. The liquid adhesive was cured in a mold sandwiched between two stainless steel plates at 150° C. for 5 min. The results are shown in Table 3.

TABLE 3

| Example | Fluoro fluid | Visual Appearance after mixing | Stability on storage (1 day at RT) | Visual Appearance after cure |
|---|---|---|---|---|
| Comparative Example 2 | $M^{Vi}D^f_{6-8}M^{Vi}$ (100% F) | White/opaque | Phase separation | White/opaque |
| Comparative Example 1 | $M^{Vi}D_{4.5}D^f_3M^{Vi}$ (40% F) | White/opaque | Phase separation | White/opaque |
| Example 10 | $M^{Vi}D_{63}D^f_{6.7}M^{Vi}$ (9.3% F) | Clear/transparent | Uniform | Clear/transparent |

The following additional embodiments are provided, the numbering of which is not to be construed as designating levels of importance:

Embodiment 1 relates to a temporary bonding adhesive composition, wherein the composition comprises a fluoro-containing silicone, wherein the composition when coated onto a first substrate forms a film that can be bonded to a second substrate to form a laminate sequentially comprising the first substrate, the film, and the second substrate; and debonded from the second substrate to obtain a second substrate substantially free of the fluoro-containing silicone, wherein the fluoro-containing silicone has the general formula:

$$M'[D_oD^f_pD^x_q]_nM' \qquad (I)$$

wherein M' is a vinyl or hydrogen functionalized unit; $D^f$ unit comprises a fluoro-substituted group; $D^x$ unit comprises a vinyl or silicon hydride (SiH) functionalized group; $1>o\geq0$, $1>p>0$, and $1>q\geq0$ wherein $o+p+q=1$ and p is equal to or less than 20% mole percent of the sum of $o+p+q$; and n is an integer from 1 to 1000.

Embodiment 2 relates to Embodiment 1, wherein the composition is stable at room temperature for at least one month and can be thermally cured at a temperature of 100° C. to 180° C.

Embodiment 3 relates to Embodiment 1 or 2, wherein the fluoro-containing silicone is an alkenyl functional organosiloxane polymer comprising a fluoro-substituted $C_3$-$C_{23}$ hydrocarbyl group.

Embodiment 4 relates to Embodiment 1, 2 or 3, wherein the fluoro-containing silicone is a SiH functional organosiloxane polymer comprising a fluoro-substituted $C_3$-$C_{23}$ hydrocarbyl group.

Embodiment 5 relates to a temporary bonding adhesive composition comprising:
a) a fluoro-containing silicone having the general formula; $M'[D_oD^f_pD^x_q]_nM'$ (I) wherein M' is a vinyl or hydrogen functionalized unit; $D^f$ unit comprises a fluoro-substituted group; $D^x$ unit comprises a vinyl or SiH functionalized group; $1>o\geq0$, $1>p>0$, and $1>q\geq0$ wherein $o+p+q=1$ and p is equal to or less than 20% mole percent of the sum of $o+p+q$; and n is an integer from 1 to 1000;

b) an alkenyl functional polydimethylsiloxane fluid;
c) an alkenyl functional MQ siloxane resin;
d) an SiH functional siloxane crosslinker; and
e) a hydrosilylation catalyst.

Embodiment 6 relates to Embodiment 5, wherein the fluoro-containing silicone is an alkenyl functional siloxane polymer having the general formula:

wherein each R is independently a $C_1$-$C_6$ hydrocarbyl group; $R^f$ is a fluoro-substituted $C_3$-$C_{23}$ hydrocarbyl group; X is an alkenyl group; $R^1$ is either a hydrocarbyl group (R) or/and an alkenyl group (X) group; n is an integer from 1 to 1000; and $1>o\geq 0$, $1>p>0$, and $1>q\geq 0$ wherein $o+p+q=1$ and p is equal to or less than 20% mole percent of the sum of $o+p+q$.

Embodiment 7 related to Embodiment 5, wherein the fluoro-containing silicone is a silicon hydride (SiH) functional organosiloxane polymer having the general formula:

wherein each R is independently a $C_1$-$C_6$ hydrocarbyl group; $R^f$ is a fluoro-substituted $C_3$-$C_{23}$ hydrocarbyl group; n is an integer from 1 to 200; $R^1$ is either a hydrocarbyl group (R) or/and a hydride group; $1>o\geq 0$, $1>p>0$, and $1>q\geq 0$ wherein $o+p+q=1$ and p is equal or less than 20% mole percent of the sum of $o+p+q$; and if $R^1$ is a hydrocarbyl group, then $1>q>0$.

Embodiment 8 relates to Embodiment 6 or 7, wherein R is independently methyl, ethyl, n-propyl, propan-2-yl, n-butyl, sec-butyl, iso-butyl, tert-butyl, or phenyl.

Embodiment 9 relates to Embodiment 8, wherein $R^f$ is —$(CH_2)_2(CF_2)_wCF_3$ wherein w is 0 or an integer from 1 to 20.

Embodiment 10 relates to Embodiment 9, wherein $R^f$ is —$(CH_2)_2CF_3$, —$(CH_2)_2(CF_2)_5CF_3$, —$(CH_2)_2(CF_2)_7CF_3$, or —$(CH_2)_2(CF_2)_9CF_3$.

Embodiment 11 relates to any one of Embodiments 5 to 10, further comprising a cure inhibitor, wherein the cure inhibitor is an organic compound that comprises at least one unsaturated bond and/or at least one heteroatom.

Embodiment 12 relates to Embodiment 11, wherein the cure inhibitor is an amine, an alkenyl ester, or an alkynyl alcohol.

Embodiment 13 relates to Embodiment 12, wherein the cure inhibitor is a maleate compound having the general formula cis-$R^2$OOC—CH=CH—COO$R^2$, wherein $R^2$ is a $C_1$-$C_6$ hydrocarbyl group.

Embodiment 14 relates to Embodiment 13, wherein the cure inhibitor is diallyl maleate.

Embodiment 15 relates to any one of Embodiments 5 to 14, wherein the hydrosilylation catalyst is a platinum catalyst or a rhodium catalyst.

Embodiment 16 relates to any one of Embodiments 11 to 15, wherein the molar ratio of the cure inhibitor to the hydrosilylation catalyst is about 40:1 to about 300:1.

Embodiment 17 relates to Embodiment 16, wherein the molar ratio of the cure inhibitor to the hydrosilylation catalyst is about 200:1.

Embodiment 18 relates to any one of Embodiments 5 to 17, wherein the alkenyl functional polydimethylsiloxane fluid is vinyl terminated polydimethylsiloxane fluid.

Embodiment 19 relates to any one of Embodiments 5 to 18, wherein the alkenyl functional MQ siloxane resin is a vinyl functional MQ silicone resin.

Embodiment 20 relates to a temporary bonding adhesive composition comprising:
a) at least one fluoro-containing silicone having the general formula;

$$M'[D_oD^f_pD^x_q]_nM' \qquad (I)$$

wherein M' is a vinyl or hydrogen functionalized unit; $D^f$ unit comprises a fluoro-substituted group; $D^x$ unit comprises a vinyl or hydrogen functionalized group; $1>o\geq 0$, $1>p>0$, and $1>q\geq 0$ wherein $o+p+q=1$ and p is equal or less than 20% mole percent of the sum of $o+p+q$; and n is an integer from 1 to 1000;
b) at least one vinyl functional polydimethylsiloxane fluid;
c) at least one vinyl functional MQ siloxane resin;
d) at least one SiH functional organosiloxane crosslinker;
e) a hydrosilylation catalyst, wherein the amount of hydrosilylation catalyst is from about 1 ppm to about 500 ppm; and
f) a cure inhibitor, wherein the molar ratio of the cure inhibitor to the hydrosilylation catalyst is about 200:1.

Embodiment 21 relates to a cured composition comprising a product of curing the adhesive composition of any one of the preceding Embodiments.

Embodiment 22 relates to a semiconductor coated with the adhesive composition of any one of Embodiments 1 to 20 or the cured composition of Embodiment 21.

Embodiment 23 relates to a method for making a temporary bonded substrate system, the method comprising:
(1) applying a temporary bonding adhesive composition onto a surface of a first substrate, wherein the adhesive composition applied onto the surface of the first substrate forms a temporary bonding adhesive film, wherein the temporary bonding adhesive composition comprises;
a fluoro-containing silicone having the general formula:

$$M'[D_oD^f_pD^x_q]_nM' \qquad (I)$$

wherein M' is a vinyl or hydrogen functionalized unit; $D^f$ unit comprises a fluoro substituted group; $D^x$ unit comprises a vinyl or hydrogen functionalized group; $1>o\geq 0$, $1>p>0$, and $1>q\geq 0$ wherein $o+p+q=1$ and p is equal or less than 20% mole percent of the sum of $o+p+q$; and n is an integer from 1 to 1000;
an alkenyl functional polydimethylsiloxane fluid;
an alkenyl functional MQ siloxane resin;
an SiH functional siloxane crosslinker;
a hydrosilylation catalyst; and a cure inhibitor; and
(2) contacting a second substrate with the temporary bonding adhesive film and curing the temporary bonding adhesive film to form the temporary bonded substrate system, wherein the cured temporary bonding adhesive film is in contact with the surface of the first substrate and with a surface of the second substrate.

Embodiment 24 relates to a method for making a temporary bonded wafer system, the method comprising:
(1) applying a temporary bonding adhesive composition onto a release layer of a release layer coated device wafer to form an adhesive coated device wafer, wherein the adhesive composition applied onto the release layer forms a temporary bonding adhesive film, wherein the temporary bonding adhesive composition comprises;
a fluoro-containing silicone having the general formula:

$$M'[D_oD^f_pD^x_q]_nM' \qquad (I)$$

wherein M' is a vinyl or hydrogen functionalized unit; $D^f$ unit comprises a fluoro substituted group, $D^x$ unit comprises a vinyl or hydrogen functionalized group; $1>o\geq0$, $1>p>0$, and $1>q\geq0$ wherein $o+p+q=1$ and p is equal or less than 20% mole percent of the sum of $o+p+q$; and n is an integer from 1 to 1000;
an alkenyl functional polydimethylsiloxane fluid;
an alkenyl functional MQ siloxane resin;
an SiH functional siloxane crosslinker;
a hydrosilylation catalyst; and a cure inhibitor; and
(2) contacting a carrier wafer onto the temporary bonding adhesive film and curing the temporary bonding adhesive film to form the temporary bonded wafer system, wherein the temporary bonding adhesive film is in contact with the release layer and with a surface of the carrier wafer.

Embodiment 25 relates to a method for making a temporary bonded wafer system, the method comprising:
(1) applying a temporary bonding adhesive composition to a surface of a carrier wafer to form an adhesive coated carrier wafer, wherein the adhesive composition applied onto the surface of the carrier wafer forms a temporary bonding adhesive film, wherein the temporary bonding adhesive composition comprises;
a fluoro-containing silicone having the general formula:

$$M'[D_oD^f_pD^x_q]_nM' \qquad (I)$$

wherein M' is a vinyl or hydrogen functionalized unit; $D^f$ unit comprises a fluoro substituted group, $D^x$ unit comprises a vinyl or hydrogen functionalized group; $1>o\geq0$, $1>p>0$, and $1>q\geq0$ wherein $o+p+q=1$ and p is equal or less than 20% mole percent of the sum of $o+p+q$; and n is an integer from 1 to 1000;
an alkenyl functional polydimethylsiloxane fluid;
an alkenyl functional MQ siloxane resin;
an SiH functional siloxane crosslinker;
a hydrosilylation catalyst; and
a cure inhibitor; and
(2) contacting a release layer coated device wafer with the adhesive coated carrier wafer and curing the temporary bonding adhesive film to form the temporary bonded wafer system, wherein the cured temporary bonding adhesive film is in contact with the release layer and the surface of the carrier wafer.

Embodiment 26 relates to Embodiment 24 or 25, further comprising performing at least one wafer processing operation on the device wafer to form a processed wafer system.

Embodiment 27 relates to Embodiment 24 or 25, further comprising debonding the processed wafer system by initiating separation between the release layer and the cured temporary bonding adhesive film to obtain a processed device wafer.

Embodiment 28 relates to Embodiment 24 or 25, further comprising cleaning at least one surface of the processed device wafer with an organic solvent, wherein the organic solvent is capable of dissolving the release layer.

Embodiment 29 relates to any one of Embodiments 24 to 28, wherein the temporary bonding adhesive film has a thickness from about 1 micrometer to about 500 micrometers.

Embodiment 30 relates to one of Embodiments 24 to 29, wherein the molar ratio of the cure inhibitor to the hydrosilylation catalyst is about 40:1 or greater.

Embodiment 31 relates to one of Embodiments 24 to 30, wherein the cure inhibitor is a maleate compound.

Embodiment 32 relates to any one of Embodiments 24 to 31, wherein the release layer is selected from a silsesquioxane-based resin or a thermoplastic resin and wherein the release layer is capable of withstanding exposure up to about 180° C. without the occurrence of substantial cross-linking.

The inventive compositions and components thereof, and the inventive methods and steps thereof, are generally as described above. All combinations of the aforementioned embodiments are hereby expressly contemplated.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and/or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:

1. An adhesive composition, wherein the adhesive composition comprises a fluoro-containing silicone, wherein the adhesive composition when coated onto a first substrate forms a film that can be bonded to a second substrate to form a laminate sequentially comprising the first substrate, the film, and the second substrate; and debonded from the second substrate to obtain a second substrate substantially free of the fluoro-containing silicone, wherein the fluoro-containing silicone has the general formula:

$$M'[D_o D^f_p D^x_q]_n M' \qquad (I)$$

wherein
M' is an alkenyl or a hydrogen functionalized unit;
$D^f$ unit comprises a fluoro-substituted group;
$D^x$ unit comprises an alkenyl or a silicon hydride (SiH) functionalized group;
$1 > o \geq 0$, $1 > p > 0$, and $1 > q \geq 0$ wherein $o+p+q=1$ and p is equal to or less than 20% mole percent of the sum of o+p+q; and
n is an integer from 1 to 1000.

2. The adhesive composition of claim 1, wherein the adhesive composition is stable at room temperature for at least one month and can be thermally cured at a temperature of 100° C. to 180° C.

3. The adhesive composition of claim 1, wherein the fluoro-containing silicone is an alkenyl functional, alternatively a vinyl functional, organosiloxane polymer comprising a fluoro-substituted $C_3$-$C_{23}$ hydrocarbyl group.

4. The adhesive composition of claim 1, wherein the fluoro-containing silicone is a SiH functional organosiloxane polymer comprising a fluoro-substituted $C_3$-$C_{23}$ hydrocarbyl group.

5. The adhesive composition of claim 1, wherein the fluoro-containing silicone is an alkenyl functional siloxane polymer having the general formula:

wherein each R is independently a $C_1$-$C_6$ hydrocarbyl group, alternatively each R is independently methyl, ethyl, n-propyl, propan-2-yl, n-butyl, sec-butyl, iso-butyl, tert-butyl, or phenyl; $R^f$ is a fluoro-substituted $C_3$-$C_{23}$ hydrocarbyl group; X is an alkenyl group; $R^1$ is either a hydrocarbyl group (R) or/and an alkenyl group (X) group; n is an integer from 1 to 1000; and $1 > o \geq 0$, $1 > p > 0$, and $1 > q \geq 0$ wherein $o+p+q=1$ and p is equal to or less than 20% mole percent of the sum of o+p+q.

6. The adhesive composition of claim 5, wherein $R^f$ is —$(CH_2)_2(CF_2)_w CF_3$ wherein w is 0 or an integer from 1 to 20, alternatively $R^f$ is —$(CH_2)_2 CF_3$, —$(CH_2)_2(CF_2)_5 CF_3$, —$(CH_2)_2(CF_2)_7 CF_3$, or —$(CH_2)_2(CF_2)_9 CF_3$.

7. A semiconductor coated with the adhesive composition of 1, optionally wherein the adhesive composition is cured.

8. The adhesive composition of claim 1, further comprising:
b) an alkenyl functional polydimethylsiloxane fluid;
c) an alkenyl functional MQ siloxane resin;
d) an SiH functional siloxane crosslinker; and
e) a hydrosilylation catalyst.

9. The adhesive composition of claim 8, further comprising: f) a cure inhibitor; wherein the cure inhibitor is an organic compound that comprises at least one unsaturated bond and/or at least one heteroatom.

10. The adhesive composition of claim 9, wherein the cure inhibitor is an amine, an alkenyl ester, or an alkynyl alcohol.

11. The adhesive composition of claim 9, wherein the cure inhibitor is a maleate compound having the general formula cis-$R^2 OOC$—$CH$=$CH$—$COOR^2$, wherein $R^2$ is a $C_1$-$C_6$ hydrocarbyl group, alternatively the cure inhibitor is diallyl maleate.

12. The adhesive composition of claim 9, wherein the molar ratio of the cure inhibitor to the hydrosilylation catalyst is about 40:1 to about 300:1, alternatively is about 200:1.

13. The adhesive composition of claim 8, wherein the hydrosilylation catalyst is a platinum catalyst or a rhodium catalyst.

14. The adhesive composition of claim 8, wherein the alkenyl functional polydimethylsiloxane fluid is vinyl terminated polydimethylsiloxane fluid.

15. The adhesive composition of claim 8, wherein the alkenyl functional MQ siloxane resin is a vinyl functional MQ silicone resin.

16. A method for making a substrate system, the method comprising:
(1) applying an adhesive composition onto a surface of a first substrate, wherein the adhesive composition applied onto the surface of the first substrate forms an adhesive film; and
(2) contacting a second substrate with the adhesive film and curing the adhesive film to form the substrate system, wherein the cured adhesive film is in contact with the surface of the first substrate and with a surface of the second substrate;
wherein the adhesive composition is according to claim 8 and further comprises f) a cure inhibitor.

17. An adhesive composition comprising:
a) a fluoro-containing silicone having the general formula;

$$M'[D_o D^f_p D^x_q]_n M' \qquad (I)$$

wherein M' is a vinyl or hydrogen functionalized unit; $D^f$ unit comprises a fluoro-substituted group; $D^x$ unit comprises a vinyl or SiH functionalized group; $1 > o \geq 0$, $1 > p > 0$, and $1 > q \geq 0$ wherein $o +p +q =1$ and p is equal to or less than 20% mole percent of the sum of o +p +q; and n is an integer from 1 to 1000;
b) an alkenyl functional polydimethylsiloxane fluid;
c) an alkenyl functional MQ siloxane resin;
d) an SiH functional siloxane crosslinker; and
e) a hydrosilylation catalyst.

18. The adhesive composition of claim 17, wherein the fluoro-containing silicone is a silicon hydride (SiH) functional organosiloxane polymer having the general formula:

wherein each R is independently a $C_1$-$C_6$ hydrocarbyl group, alternatively each R is independently methyl, ethyl, n-propyl, propan-2-yl, n-butyl, sec-butyl, iso-butyl, tert-butyl, or phenyl; $R^f$ is a fluoro-substituted $C_3$-$C_{23}$ hydrocarbyl group, alternatively $R^f$ is —$(CH_2)_2(CF_2)_wCF_3$ wherein w is 0 or an integer from 1 to 20, alternatively $R^f$ is —$(CH_2)_2CF_3$, —$(CH_2)_2(CF_2)_5CF_3$, —$(CH_2)_2(CF_2)_7CF_3$, or —$(CH_2)_2(CF_2)_9CF_3$; n is an integer from 1 to 200; $R^1$ is either a hydrocarbyl group (R) or/and a hydride group; and $1>o\geq0$, $1>p>0$, and $1>q\geq0$ wherein $o+p+q=1$ and p is equal or less than 20% mole percent of the sum of $o+p+q$; provided that if $R^1$ is a hydrocarbyl group, then $1>q>0$.

19. A method for making a wafer system, the method comprising:
(1) applying an adhesive composition onto a release layer of a release layer coated device wafer to form an adhesive coated device wafer, wherein the adhesive composition applied onto the release layer forms an adhesive film; and
(2) contacting a carrier wafer onto the adhesive film and curing the adhesive film to form the wafer system, wherein the adhesive film is in contact with the release layer and with a surface of the carrier wafer;
wherein the adhesive composition is according to claim 17 and further comprises f) a cure inhibitor.

20. A method for making a wafer system, the method comprising:
(1) applying an adhesive composition to a surface of a carrier wafer to form an adhesive coated carrier wafer, wherein the adhesive composition applied onto the surface of the carrier wafer forms an adhesive film; and
(2) contacting a release layer coated device wafer with the adhesive coated carrier wafer and curing the adhesive film to form the wafer system, wherein the cured adhesive film is in contact with the release layer and the surface of the carrier wafer;
wherein the adhesive composition is according to claim 17 and further comprises f) a cure inhibitor.

* * * * *

UNITED STATES PATENT AND TRADEMARK OFFICE
CERTIFICATE OF CORRECTION

PATENT NO. : 10,147,631 B2
APPLICATION NO. : 15/276357
DATED : December 4, 2018
INVENTOR(S) : Fu et al.

Page 1 of 1

It is certified that error appears in the above-identified patent and that said Letters Patent is hereby corrected as shown below:

In the Claims

Column 24, Claim 18, Line 65: the chemical structure:

Should be:

Signed and Sealed this
Fourteenth Day of May, 2019

Andrei Iancu
*Director of the United States Patent and Trademark Office*